United States Patent
Chan et al.

(10) Patent No.: US 9,356,114 B2
(45) Date of Patent: May 31, 2016

(54) LATERAL HETEROJUNCTION BIPOLAR TRANSISTOR WITH LOW TEMPERATURE RECESSED CONTACTS

(71) Applicant: GLOBALFOUNDRIES INC., Grand Cayman (KY)

(72) Inventors: Kevin K. Chan, Staten Island, NY (US); Bahman Hekmatshoartabari, White Plains, NY (US); Tak H. Ning, Yorktown Heights, NY (US); Davood Shahrjerdi, White Plains, NY (US)

(73) Assignee: GLOBALFOUNDRIES INC., Grand Cayman (KY)

(*) Notice: Subject to any disclaimer, the term of this patent is extended or adjusted under 35 U.S.C. 154(b) by 240 days.

(21) Appl. No.: 14/042,951

(22) Filed: Oct. 1, 2013

(65) Prior Publication Data

US 2015/0093872 A1    Apr. 2, 2015

(51) Int. Cl.
| | |
|---|---|
| H01L 21/00 | (2006.01) |
| H01L 29/66 | (2006.01) |
| H01L 21/283 | (2006.01) |
| H01L 29/737 | (2006.01) |
| H01L 29/08 | (2006.01) |
| H01L 29/10 | (2006.01) |
| H01L 21/308 | (2006.01) |

(52) U.S. Cl.
CPC ........ H01L 29/66242 (2013.01); H01L 21/283 (2013.01); H01L 29/0817 (2013.01); H01L 29/1004 (2013.01); H01L 29/7371 (2013.01); H01L 21/3086 (2013.01)

(58) Field of Classification Search
CPC ............. H01L 29/66242; H01L 29/7371; H01L 29/0817; H01L 29/1004
See application file for complete search history.

(56) References Cited

U.S. PATENT DOCUMENTS

| 5,108,936 A |   | 4/1992  | Ghannam et al. |
|---|---|---|---|
| 5,374,481 A | * | 12/1994 | Jeng .................... H01L 21/2256 257/537 |
| 8,486,797 B1 |   | 7/2013  | Hekmatshoartabari et al. |

(Continued)

FOREIGN PATENT DOCUMENTS

CN          102709340 A          10/2012

OTHER PUBLICATIONS

Hekmatshoar, B. et al. "Heterojunction Bipolar Transistors With Hydrogenated Amorphous Silicon Contacts on Crystalline Silicon" Electronics Letters. vol. 48 No. 18. Aug. 2012. (2 Pages).

*Primary Examiner* — Laura Menz
(74) *Attorney, Agent, or Firm* — Catherine Ivers; Hoffman Warnick LLC

(57) ABSTRACT

A method of forming the heterojunction bipolar transistor that includes providing a stack of a base layer, an extrinsic base layer, a first metal containing layer, and a dielectric cap layer. The dielectric cap layer and the first metal containing layer may be etched to provide a base contact and a dielectric cap. Exposed portions of the base layer may be etched selectively to the dielectric cap. A remaining portion of the base layer provides the base region. A hydrogenated silicon containing layer may be deposited with a low temperature deposition method. At least a portion of the hydrogenated silicon containing layer is formed on at least sidewalls of the base region. A second metal containing layer may be formed on the hydrogenated silicon containing layer. The second metal containing and the hydrogenated silicon containing layer may be etched to provide an emitter region and a collector region.

8 Claims, 3 Drawing Sheets

(56) References Cited

U.S. PATENT DOCUMENTS

| | | | |
|---|---|---|---|
| 2012/0139009 A1* | 6/2012 | Ning | H01L 29/7317 257/197 |
| 2012/0210932 A1 | 8/2012 | Hekmatshoar-tabari et al. | |
| 2012/0318339 A1 | 12/2012 | Abou-Kandil et al. | |
| 2013/0092218 A1 | 4/2013 | Bedell et al. | |
| 2013/0095598 A1 | 4/2013 | Bedell et al. | |

* cited by examiner

LATERAL HETEROJUNCTION BIPOLAR TRANSISTOR WITH LOW TEMPERATURE RECESSED CONTACTS

BACKGROUND

1. Technical Field

The present disclosure relates to semiconductor devices. The present disclosure further relates to heterojunction bipolar transistors.

2. Description of the Related Art

Lateral heterojunction bipolar transistors (HBT) can be formed by depositing the emitter, base and/or collector contacts by plasma-enhanced chemical vapor deposition (PECVD) of hydrogenated silicon (Si:H) containing materials. Although the access resistance of the HBT devices can be sufficient for applications in large-area electronics, the access resistance of the devices can be too high for applicability to very large scale integration (VLSI) applications. Doping the emitter region and the collector region underneath the PECVD deposited contact regions can reduce the access resistance, and/or increase the current gain of the bipolar transistor by reducing the effective base width. However, high temperatures are required for activating the doping incorporated by ion implantation and/or for the diffusion of dopants. Furthermore, high temperature activation of the doped regions may create defects in the semiconductor material, resulting in undesired doping diffusion and junction widening. Further, in some applications where thin layers of semiconductor material is transferred and bonded onto low-cost flexible substrates, the high temperatures required for implantation/activation and/or diffusion is incompatible with low-cost flexible substrates.

SUMMARY

In one embodiment, the present disclosure provides a lateral heterojunction bipolar transistor (HBT) having at least an emitter region and collector region that are formed using low temperature plasma enhanced chemical vapor deposition (PECVD) of hydrogenated silicon (Si:H) containing materials, in which the access resistance to the emitter and/or collector of the device is reduced by recessing a portion of the emitter region and collector region on which the emitter contact and collector contact is formed. In addition, in some embodiments, the current gain of the HBT is improved by effectively reducing the base width and/or reducing the emitter/base junction area. Reducing the emitter/base junction area reduces the net recombination at the emitter/base junction resulting in a lower base current (provided that recombination at the emitter/base junction is not negligible compared to other sources of recombination) and therefore results in a higher current gain.

In one embodiment, the method for forming the heterojunction bipolar transistor (HBT) may include forming a dielectric cap layer over a portion of a base layer. The exposed portions of the base layer are etched selectively to the dielectric cap, wherein a remaining portion of the base layer provides the base region. A hydrogenated silicon containing layer is deposited with a low temperature deposition method, wherein at least a portion of the hydrogenated silicon containing layer is formed on at least sidewalls of the base region. A second metal containing layer may be formed on the hydrogenated silicon containing layer. The second metal containing layer and the hydrogenated silicon containing layer may be etched to provide an emitter contact and an emitter region on a first side of the base region and a collector contact and a collector region on a second side of the base region opposing the first side.

In another embodiment, the present disclosure provides a method of forming a lateral heterojunction bipolar transistor, in which at least the emitter region and collector region are epitaxially formed using low temperature PECVD of a hydrogenated silicon containing material. The method for forming the heterojunction bipolar transistor may include providing a stack of a base layer, a first metal containing layer on the base layer, and a dielectric cap layer on the first metal containing layer. The dielectric cap layer and the first metal containing layer may be etched selectively to the base layer. A remaining portion of the first metal containing layer provides a base contact and a remaining portion of the dielectric cap layer provides a dielectric cap. A dielectric spacer may be formed on the sidewall of the dielectric cap and the base contact. The exposed portion of the base layer may be etched selectively to the dielectric cap and the dielectric spacer, wherein a remaining portion of the base layer provides a base region having a stepped sidewall. A hydrogenated silicon containing layer may be epitaxially deposited with a low temperature deposition method, wherein at least a crystalline portion of the hydrogenated silicon containing layer is formed on at least the stepped sidewall of the base region and an amorphous portion of the hydrogenated silicon containing layer is formed on the dielectric cap and the dielectric spacer. The amorphous portion of the hydrogenated silicon containing layer may be removed with an etch that is selective to the crystalline portion of the hydrogenated silicon containing layer. The crystalline portion of the hydrogenated silicon containing layer provides a collector region and an emitter region. A collector contact is formed on the collector region and an emitter contact is formed on the emitter region.

According to another aspect of the present disclosure, a heterojunction bipolar transistor is provided. In one embodiment, the heterojunction bipolar transistor device includes a base region on a dielectric substrate layer. The heterojunction bipolar transistor also includes a collector region on the dielectric substrate layer in contact with a first sidewall of the base region. The collector region may include a recessed portion having an upper surface that is below an upper surface of the base region. The heterojunction bipolar transistor also includes an emitter region on the dielectric substrate layer in contact with a second sidewall of the base region that is opposite the first sidewall of the base region. The emitter region may include a recessed portion having an upper surface that is below an upper surface of the base region. A contact may be present on at least one of the recessed portions of the emitter region and the collector region.

BRIEF DESCRIPTION OF THE DRAWINGS

The following detailed description, given by way of example and not intended to limit the disclosure solely thereto, will best be appreciated in conjunction with the accompanying drawings, wherein like reference numerals denote like elements and parts, in which.

DETAILED DESCRIPTION OF THE PREFERRED EMBODIMENTS

Figure 1:
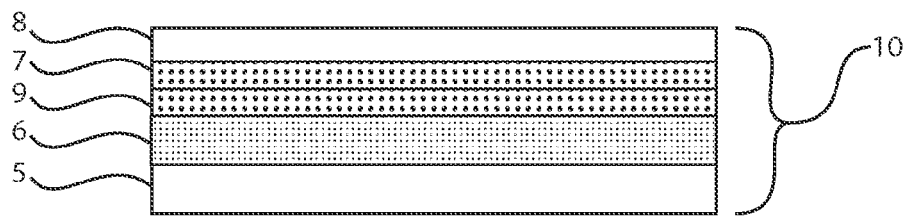
FIG. 1 is a side cross-sectional view of a stack of a dielectric substrate layer, a base layer, an extrinsic base layer, a first metal containing layer, and a dielectric cap layer, as used in accordance with one embodiment of the present disclosure.

Detailed embodiments of the claimed structures and methods are disclosed herein; however, it is to be understood that the disclosed embodiments are merely illustrative of the claimed structures and methods that may be embodied in various forms. In addition, each of the examples given in connection with the various embodiments are intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure. For purposes of the description hereinafter, the terms "upper", "lower", "right", "left", "vertical", "horizontal", "top", "bottom", and derivatives thereof shall relate to the embodiments of the disclosure, as it is oriented in the drawing figures. The term "positioned on" means that a first element, such as a first structure, is present on a second element, such as a second structure, wherein intervening elements, such as an interface structure, e.g. interface layer, may be present between the first element and the second element. The term "direct contact" means that a first element, such as a first structure, and a second element, such as a second structure, are connected without any intermediary conducting, insulating or semiconductor layers at the interface of the two elements.

In some embodiments, the methods and structures disclosed herein provide lateral HBT devices where the emitter region and collector region of the device, as well as an optional extrinsic base region, are formed by a low temperature plasma enhanced chemical vapor deposition (PECVD) process. The term "bipolar junction transistor" denotes a type of transistor made of three regions of semiconductor materials each having an inherent electrical charge, i.e., conductivity, such as n-type or p-type conductivity. Each region has been treated, e.g., doped, so that the layer in the middle (called the base region) has a first conductivity type, while the layers around it, i.e., the emitter region and the collector region) have a second conductivity type opposite to the first conductivity type. A bipolar junction transistor with an n-type base is designated PNP, and one with a p-type base is designated NPN. When subjected to current flow, the base acts like a gate, enhancing or inhibiting the current flow from the emitter to the collector. The "heterojunction bipolar transistor (HBT)" is a type of bipolar junction transistor (BJT) which uses differing semiconductor base materials, e.g., silicon and germanium, for the emitter and base regions, creating a heterojunction. In some embodiments, the heterojunction bipolar transistor is lateral, i.e., has a lateral orientation. By having a "lateral orientation" it is meant that the emitter region, base region and collector region are present on a substrate and are orientated left to right, or right to left, as depicted in the supplied figures.

Plasma enhanced chemical vapor deposition (PECVD) is a process used to deposit films from a gas state (vapor) to a solid state on a substrate. Chemical reactions are included for the deposition process, which occur after creation of a plasma of the reacting gases. A "plasma" is any gas in which a percentage of the atoms or molecules are ionized. In some embodiments, the degree of ionization may vary from $10^{-4}$ to as high as 5-10%. In some examples, the plasma employed in the PECVD process is created by RF (AC) frequency or DC discharge between two electrodes, wherein the space between the two electrodes is filled with the reacting gases of the PECVD process. In some embodiments, the PECVD process is a low temperature process. By "low temperature deposition" or "low temperature PECVD" it is meant that the deposition temperature is no greater than 450° C. The deposition temperature is measured at the deposition surface. In some examples, the deposition temperature of the PECVD process may range from 150° C. to 250° C.

In some embodiments, the methods and structures disclosed herein provide contacts having a low access resistance to the collector region and emitter region by forming "recessed contacts". The "access resistance" refers to the effective series resistance in the electrical current path associated with a region of a device. This includes but not limited to contact resistance (e.g. of metal or silicide to semiconductor), sheet resistance of the doped contact regions and current crowding underneath the doped contact regions. The contacts are the structures bringing electrical current to the three terminals, i.e., base region, collector region, and emitter region, of the transistor. By "recessed" it is meant at least a portion of the at least one of the collector/base junction and/or emitter/base junction is below an upper surface of the base region. In some embodiments, the methods and structures disclosed herein improve the current gain of the HBT by effectively reducing the base width and/or reducing the emitter/base junction area. The methods and structures of the present disclosure are now described in more detail with reference to FIGS. 1-14.

FIG. 1 depicts a stack 10 of a dielectric substrate layer 5, a base layer 6, an extrinsic base layer 9, a first metal containing layer 7 and a dielectric cap layer 8. The dielectric substrate layer 5 may be composed of any dielectric material, such as an oxide, nitride or oxynitride material. For example, the dielectric substrate layer 5 may be composed of silicon oxide ($SiO_2$), silicon nitride ($Si_3N_4$), silicon oxynitride or a combination thereof. The dielectric substrate layer 5 may also be composed of glass or polymeric material. The dielectric substrate layer 5 may have a thickness ranging from 10 nm to 5 microns. In another embodiment, the dielectric substrate layer 5 may have a thickness ranging from 20 nm to 100 nm.

The base layer 6 may be composed of a semiconductor material. For example, in some embodiments, the base layer 6 may be composed of silicon, silicon germanium, silicon germanium doped with carbon (SiGe:C), silicon carbon (Si:C), and compound semiconductors, such as III-V semiconductors. Examples of compound semiconductor materials that are suitable for use in the base layer 6 may include aluminum antimonide (AlSb), aluminum arsenide (AlAs), aluminum nitride (AlN), aluminum phosphide (AlP), gallium arsenide (GaAs), gallium phosphide (GaP), indium antimonide (InSb), indium arsenic (InAs), indium nitride (InN), indium phosphide (InP), aluminum gallium arsenide (AlGaAs), indium gallium phosphide (InGaP), aluminum indium arsenic (AlInAs), aluminum indium antimonide (AlInSb), gallium arsenide nitride (GaAsN), gallium arsenide antimonide (GaAsSb), aluminum gallium nitride (AlGaN), aluminum gallium phosphide (AlGaP), indium gallium nitride (InGaN), indium arsenide antimonide (InAsSb), indium gallium antimonide (InGaSb), aluminum gallium indium phosphide (AlGaInP), aluminum gallium arsenide phosphide (AlGaAsP), indium gallium arsenide phosphide (InGaAsP), indium arsenide antimonide phosphide (InArSbP), aluminum indium arsenide phosphide (AlInAsP), aluminum gallium arsenide nitride (AlGaAsN), indium gallium arsenide nitride (InGaAsN), indium aluminum arsenide nitride (InAlAsN), gallium arsenide antimonide nitride (GaAsSbN), gallium indium nitride arsenide aluminum antimonide (GaInNAsSb), gallium indium arsenide antimonide phosphide (GaInAsSbP), and combinations thereof. It is noted that the above list of semiconductor materials is provided for illustrative purposes only, and is not an exhaustive list, as other semiconductor materials may be suitable for the base layer 6, so long as the semiconductor material can supply the base material of a base region for the heterojunction bipolar transistor. The base layer 6 may have a single crystal crystalline structure, multi-crystalline or poly-crystalline crystal structure. The base layer 6 typically has a thickness greater than 10 nm. In some embodiments, the base layer 6 has a thickness ranging from 10 nm to 250 nm.

The base layer 6 is typically doped to provide an n-type or p-type conductivity. For example, when the subsequently formed heterojunction bipolar transistor is an NPN transistor, the base layer 6 is doped to a p-type conductivity. As used herein, "p-type" refers to the addition of impurities to a semiconductor that creates deficiencies of valence electrons. In a base layer 6 composed of a type IV semiconductor material, such as germanium or silicon, examples of p-type dopants include but are not limited to boron, aluminum, gallium and indium. In one embodiment, in which the base layer 6 has a p-type conductivity, the p-type dopant is present in a concentration ranging from $1\times10^{15}$ atoms/cm$^3$ to $5\times10^{19}$ atoms/cm$^3$. In one embodiment, in which the base layer 6 has a p-type conductivity, the p-type dopant is present in a concentration ranging from $1\times10^{17}$ atoms/cm$^3$ to $5\times10^{18}$ atoms/cm$^3$.

When the subsequently formed heterojunction bipolar transistor is a PNP transistor, the base layer 6 is doped to an n-type conductivity. As used herein, "n-type" refers to the addition of impurities that contributes free electrons to a semiconductor. In a base layer 6 composed of a type IV semiconductor, such as germanium or silicon, examples of n-type dopants, i.e., impurities, include but are not limited to, antimony, arsenic and phosphorous. In one embodiment, in the base layer 6 has an n-type conductivity, the n-type dopant is present in the base layer 6 in a concentration ranging from $1\times10^{15}$ atoms/cm$^3$ to $5\times10^{19}$ atoms/cm$^3$. In another embodiment, in which the base layer 6 has an n-type conductivity, the n-type dopant is present in the base layer 6 in a concentration ranging from $1\times10^{17}$ atoms/cm$^3$ to $5\times10^{18}$ atoms/cm$^3$.

The dopant to provide the conductivity type of the base semiconductor layer 6 may be introduced to the base semiconductor layer 6 using ion implantation or in-situ doping, i.e., during crystal growth.

In some embodiments, the base layer 6 and the dielectric substrate layer 5 may be layers of a semiconductor on insulator (SOI) substrate. In the embodiments, in which the base layer 6 and the dielectric substrate layer 5 are components of an SOI substrate, a carrier semiconductor layer (not shown) may be present underlying the dielectric substrate layer 5. The carrier semiconductor layer may be composed of a semiconductor material, such as the semiconductor materials described above for the base layer 6. The carrier semiconductor layer may have a thickness ranging from 10 nm to 5 microns. In some embodiments, the SOI substrate may be formed using a bonding process, or it may be formed using an ion implantation process, such as SIMOX. In other embodiments, the base layer 6 may be formed using a deposition method, such as chemical vapor deposition, on the dielectric substrate layer 5. In one embodiment, the base layer 6 is deposited in a non-crystalline form (i.e. amorphous or nano-crystalline) and recrystallized by laser-assisted crystallization or solid-phase crystallization. In some embodiments, in which the base layer 6 is composed of germanium, the germanium base layer 6 may be formed by sublimation processes.

Still referring to FIG. 1, in some embodiments, an extrinsic base layer 9 may be present on the base layer 6. The extrinsic base layer 9 is further processed to provide an extrinsic base region. In the embodiments, in which the extrinsic base region is to be present in the final heterojunction bipolar transistor structure, the extrinsic base layer 9 may be present between and in direct contact with the base layer 6 and the subsequently formed first metal containing layer 7.

The extrinsic base layer 9 may be formed of any semiconductor material. In one example, the extrinsic base layer 9 is composed of a hydrogenated silicon containing material. In another example, the extrinsic base layer 9 may be composed of silicon. The extrinsic base layer 9 may have a single crystal crystalline structure or a multi-crystalline crystal structure. The extrinsic base layer 9 may also have an amorphous, nano-crystalline, micro-crystalline or poly-crystalline structure. The extrinsic base layer 9 also be composed of any of the semiconductor materials that have been described above for the composition of the base layer 6. The extrinsic base layer 9 has the same conductivity type, i.e., p-type or n-type conductivity, as the base layer 6. The concentration of the dopant that provides the conductivity type of the extrinsic base layer 9 is typically, but not necessarily, greater than the concentration of the dopant that provides the conductivity type of the base layer 6. For example, when the extrinsic base layer 9 has an n-type conductivity, the concentration of the n-type dopant may range from $10^{18}$ atoms/cm$^3$ to $10^{21}$ atoms/cm$^3$ although higher and lower concentrations are also possible. For example, when the extrinsic base layer 9 has a p-type conductivity, the concentration of the p-type dopant may range from $10^{18}$ atoms/cm$^3$ to $10^{21}$ atoms/cm$^3$ although higher and lower concentrations are also possible.

Referring to FIG. 1, the first metal containing layer 7 may be present in direct contact with the extrinsic base layer 9, or may be present in direct contact with the base layer 6 when the extrinsic base layer 9 is omitted. In some embodiments, the first metal containing layer 7 may be composed of aluminum, copper, tungsten, cobalt, palladium, titanium, platinum, silver, gold, nickel or combinations thereof. The first metal containing layer 7 may also be composed of metal semiconductor alloys, such as silicide materials, e.g., nickel silicide. The first metal containing layer 7 may be a single metal containing layer or may be a multi-layered structure. The first metal containing layer 7 may be formed by physical vapor deposition (PVD), such as sputtering or plating, or may be formed using chemical vapor deposition (CVD). In some embodiments, the thickness of the first metal containing layer 7 may range from 5 nm to 100 nm. The first metal containing layer 7 is subsequently processed to provide the contact to the subsequently formed extrinsic base region, or the contact to the subsequently formed base region when the extrinsic base region is omitted.

A dielectric cap layer 8 may be present on the first metal containing layer 7. The dielectric cap layer 8 may be a single layer or may be a structure composed of multiple layers. The dielectric cap layer 8 may be formed on the surface of the first metal containing layer 7 using deposition and/or thermal growth processes. In one embodiment, the dielectric cap layer 8 may be composed of amorphous hydrogenated silicon nitride ($\alpha$-SiN$_x$:H) or amorphous hydrogenated silicon oxide ($\alpha$-SiO$_x$:H). It is noted that the aforementioned materials for the dielectric cap layer 8 are provided for illustrative purposes only, and is not intended to limit the composition of the dielectric cap layer 8 to only those materials. The dielectric cap layer 8 may be composed of any material that can function as an etch mask during the subsequent etching of the first metal containing layer 7, the extrinsic base layer 9 (when present) and the base layer 6. For example, the dielectric cap layer 9 may be composed of oxides, nitrides, doped silicate glass materials, or two or more of the aforementioned materials. The dielectric cap layer may also be comprised of a high-k material such as aluminum oxide and hafnium oxide. The dielectric cap layer 8 may have a thickness ranging from 2 nm to 100 nm. In another example, the dielectric cap layer 8 has a thickness ranging from 5 nm to 50 nm.

Figure 2:
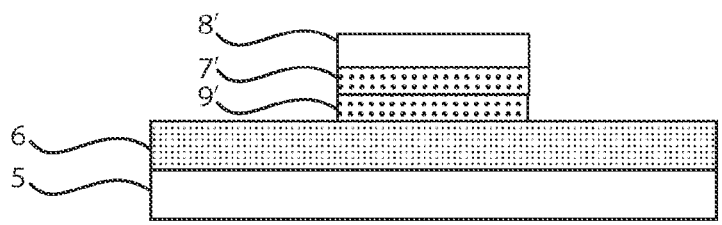
FIG. 2 is a side cross-sectional view of one embodiment of patterning the dielectric cap layer, the first metal containing layer and the extrinsic base layer selectively to the base layer, in accordance with the present disclosure.

FIG. 2 depicts one embodiment of patterning and etching the dielectric cap layer to form a dielectric cap 8'. Pattern and etching the dielectric cap layer may include forming a photoresist layer on the dielectric cap layer, patterning the photoresist layer with photolithography, and developing the patterned photoresist layer with a chemical developer to provide a first etch mask (not shown) protecting the portion of the dielectric cap layer that forms the dielectric cap 8'. Following formation of the first photoresist mask, the exposed portions of the dielectric cap layer that are not protected by the first etch mask are removed by an etch process. For example, the etch process may be an anisotropic etch, such as reactive ion etch. The etch process for defining the dielectric cap 8' may remove the material of the dielectric cap layer selectively to the first etch mask and the underlying first metal containing layer 7. As used herein, the term "selective" in reference to a material removal process, such as etching, denotes that the rate of material removal for a first material is greater than the rate of removal for at least another material of the structure to which the material removal process is being applied. In some examples, the selectivity may be greater than 100:1, e.g., 1000:1.

In some embodiments, following etching of the dielectric cap layer, the first etch mask may be removed, wherein the dielectric cap 8' functions as a hard mask during etching of the first metal containing layer to form the base contact 7', and during etching of the extrinsic base layer to form the extrinsic base region 9' (when present). In one embodiment in which a extrinsic base region 9' is present in the final heterojunction bipolar transistor (HBT) structure, the first metal containing layer and the extrinsic base layer may be etched in single stage with a single etch chemistry that is selective to the dielectric cap 8' and the base layer 6. In another embodiment, in which a extrinsic base region 9' is present in the final heterojunction bipolar transistor (HBT) structure, the first metal containing layer and the extrinsic base layer may be etched using a multi-stage etch with a first etch chemistry that removes the material for the first metal containing layer selective to the dielectric cap 8' and the extrinsic base layer, and a second etch chemistry that removes the material of the extrinsic base layer selective to the dielectric cap 8' and the base layer 6.

Figure 3:
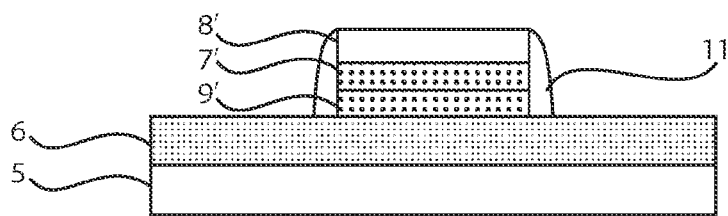
FIG. 3 is a side cross-sectional view of forming a dielectric spacer on the sidewall of the dielectric cap, the base contact and the extrinsic base region, in accordance with one embodiment of the present disclosure.

FIG. 3 depicts forming a dielectric spacer 11 on the sidewalls of the dielectric cap 8', the base contact 7' and the extrinsic base region 9'. The dielectric spacer 11 may be composed of oxide, such as SiO$_2$, but may also comprise nitride or oxynitride materials. The dielectric spacer 11 may have a width ranging from 20.0 nm to 100.0 nm although thinner and thicker spacers are also possible. The width of the dielectric spacer 11 is selected to provide that only a portion of the base layer 6 is covered by the dielectric spacer 11. The remaining portion of the base layer 6 that is exposed will be removed by a subsequent etch process. The dielectric spacer 11 can be formed by a process flow that may begin with conformal deposition of a spacer dielectric layer on an upper surface of the dielectric cap 8', sidewall surfaces of the base contact 7', sidewall surfaces of the extrinsic base region 9', and exposed portions of the base layer 6. The spacer dielectric layer may then be anisotropically etched to remove portions of the spacer dielectric layer from the upper surface of the dielectric cap 8' and the exposed portions of the base layer 6, wherein a remaining portion of the spacer dielectric layer on the sidewall surfaces provides the dielectric spacer 11.

Figure 4:
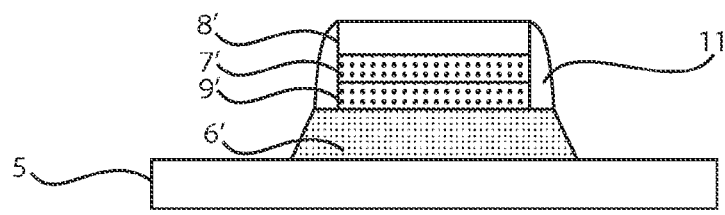
FIG. 4 is a side cross-sectional view of etching exposed portions of the base layer selectively to the dielectric spacer and the dielectric cap, wherein a remaining portion of the base layer provides the base region, in accordance with the present disclosure.

FIG. 4 depicts one embodiment of etching the exposed portions of the base layer selectively to the dielectric spacer 11 and the dielectric cap 8', wherein the remaining portion of the base layer provides the base region 6' of the heterojunction bipolar transistor. In one embodiment, the etch process for removing the exposed portions of the base layer is selective to the dielectric substrate layer 5. In this embodiment, the entirety of the thickness of the base layer that is exposed is removed, and the sidewalls of the base region 6' are substantially aligned with the outermost portion of the sidewall of the dielectric layer 11. The etch process for removing the exposed portions of the base layer may be an anisotropic, i.e., directional, etch process, such as reactive ion etch. Other examples of anisotropic etch processes suitable for etching the base layer to form the base region 6' include plasma etching, ion milling and laser etching. However, an isotropic etch process such as wet chemical etching may be used as well.

Figure 5:
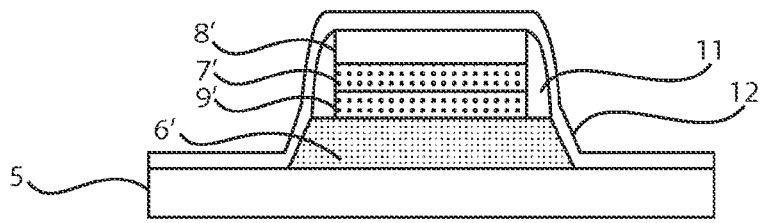
FIG. 5 is a side cross-sectional view depicting one embodiment of depositing a hydrogenated silicon containing layer with a low temperature deposition method, wherein at least a portion of the hydrogenated silicon containing layer is formed on at least sidewalls of the base region, in accordance with the present disclosure.

FIG. 5 depicts one embodiment of depositing a hydrogenated silicon containing layer 12 with a low temperature deposition method, wherein at least a portion of the hydrogenated silicon containing layer 12 is formed on at least sidewalls of the base region 6'. The hydrogenated silicon containing layer 12 is subsequently processed to provide the emitter region and the collector region of the heterojunction bipolar transistor. The hydrogenated silicon containing layer 12 may be a blanket deposited layer in which a continuous layer is formed on the dielectric cap 8', the dielectric spacers 11, the sidewalls of the base region 6' and the exposed portion of the dielectric substrate layer 5. The term "hydrogenated" as used to describe a semiconductor containing material means that the semiconductor material has hydrogen incorporated therein, wherein the hydrogen saturates at least some of the dangling bonds in the semiconductor material. Saturating the dangling bonds allows for the charge carriers to move more freely through the semiconductor material. The hydrogenated silicon containing layer 12 may be an epitaxial layer having a single crystal crystalline structure or a polycrystalline crystalline structure. The term "single crystalline" denotes a crystalline solid in which the crystal lattice of the entire material is substantially continuous and substantially unbroken to the edges of the material, with substantially no grain boundaries. The term "polycrystalline" denotes a material solely containing crystalline grains separated by grain boundaries. The hydrogenated silicon containing layer 12 may also have an amorphous crystalline structure. The term "amorphous" denotes that the semiconductor material that lacks a long-range order of atomic distance and/or bonding angle. The hydrogenated silicon containing layer 12 may be also nano-crystalline or micro-crystalline, referring to the presence nano-meter or micro-meter sized crystalline regions distributed within an amorphous medium. The hydrogenated silicon containing layer 12 may be a single layer or may be a multi-layered structure.

In one embodiment, the hydrogenated silicon containing layer 12 comprises a semiconductor material containing silicon in a content of 50 atomic percent (at. %) or greater. In another embodiment, the hydrogenated silicon containing layer 12 contains silicon in a content that is greater than 95 at. %. In another embodiment, the hydrogenated silicon containing layer 12 may include germanium therein. In another embodiment, the hydrogenated silicon containing layer 12 may also include carbon present therein. In yet another embodiment of the present disclosure, the hydrogenated silicon containing layer 12 may also include both germanium and carbon present therein.

In embodiments in which the hydrogenated silicon containing layer 12 includes germanium, the content of germanium within the hydrogenated silicon containing layer 12 is typically from greater than 1 at. % to less than 99 at. %, with a range from greater than 10 at. % ato 75 at. %, being more typical. In embodiments in which the hydrogenated silicon containing layer 12 includes carbon, the content of carbon within the hydrogenated silicon containing layer 12 is typically less than 80 at. %, with a range from greater than 10 at. % to 50 at. %, being more typical. In accordance with the present disclosure, the content of carbon and/or germanium within the hydrogenated silicon containing layer 12 may be constant or vary across the layer. In some embodiments, the hydrogenated silicon containing layer 12 may also contain at least one of nitrogen, oxygen, fluorine, and deuterium.

In some embodiments, the hydrogenated silicon containing layer 12 has an n-type or p-type conductivity. More specifically, when the base region 6' has an n-type conductivity, the hydrogenated silicon containing layer 12 is doped to a p-type conductivity, and when the base region 6' has a p-type conductivity, the hydrogenated silicon containing layer 12 is doped to an n-type conductivity. The dopant that provides the conductivity type of the hydrogenated silicon containing layer 12 may be introduced by an in-situ doping process. By "in-situ" it is meant that the dopant that provides the conductivity type of the material layer is introduced as the material layer is being formed. When doped to a p-type conductivity, the hydrogenated silicon containing layer 12 may be doped with at least one of gallium, aluminum and boron. In some embodiments, the concentration of the p-type dopant in the hydrogenated silicon containing layer 12 can range from $10^{14}$ atoms/cm$^3$ to $10^{21}$ atoms/cm$^3$. In another embodiment, the concentration of the p-type dopant in the hydrogenated silicon containing layer 12 can range from $10^{19}$ atoms/cm$^3$ to $10^{20}$ atoms/cm$^3$. When doped to an n-type conductivity, the hydrogenated silicon containing layer 12 may be doped with at least one of antimony, arsenic and phosphorus. In some embodiments, the concentration of the n-type dopant in the hydrogenated silicon containing layer 12 can range from $10^{14}$ atoms/cm$^3$ to $10^{21}$ atoms/cm$^3$. In another embodiment, the concentration of the n-type dopant in the hydrogenated silicon containing layer 12 can range from $10^{19}$ atoms/cm$^3$ to $10^{20}$ atoms/cm$^3$. The thickness of the hydrogenated silicon-containing layer 12 may range from 2 nm to 50 nm. In another embodiment, the thickness of the hydrogenated silicon-containing layer 12 may range from 2 nm to 30 nm. Other thickness that are lesser and greater than that recited above can also be employed.

The hydrogenated silicon containing layer 12 is typically formed using a low temperature PECVD process that is performed at a deposition temperature from 50° C. to 450° C. In another embodiment, the low temperature PECVD process for forming the hydrogenated silicon containing layer 12 may be performed at a deposition temperature ranging from 150° C. to 250° C. The pressure of the low temperature PECVD process for forming the hydrogenated silicon containing layer 12 may range from 0.1 Torr to 10 Torr. In another embodiment, the pressure of the low temperature PECVD process may range from 0.2 Torr to 1 Torr. The low temperature PECVD process for forming the hydrogenated silicon containing layer 12 may include at least one semiconductor precursor source material gas and a carrier. The carrier gas may contain hydrogen, and can function as the hydrogen source for the hydrogenated silicon containing layer 12. In one embodiment, the at least one semiconductor precursor source material gas includes a silicon containing precursor gas. An optional carbon containing source gas and/or germanium-containing precursor source gas may also be used. Examples of silicon containing precursor source gases that can be employed in forming the hydrogenated silicon containing layer 12 include, but are not limited to, $SiH_4$, $Si_2H_6$, $SiH_2Cl_2$ and $SiCl_4$. Examples of carbon containing precursor source gases that can be employed in forming the hydrogenated silicon containing layer 12 include, but are not limited to, $CCl_4$, and $CH_4$. Examples of germanium containing precursor source gases that can be employed in forming the hydrogenated silicon-containing layer 12 include, but are not limited to, $GeH_4$. When the hydrogenated silicon containing layer 12 is in-situ doped, examples of source gases for providing an n-type dopant include phosphine ($PH_3$) or arsine ($AsH_3$). When the hydrogenated silicon containing layer 12 is in-situ doped, examples of source gases for providing a p-type dopant include diborane ($B_2H_6$) or trimethylboron (TMB).

Figure 6:
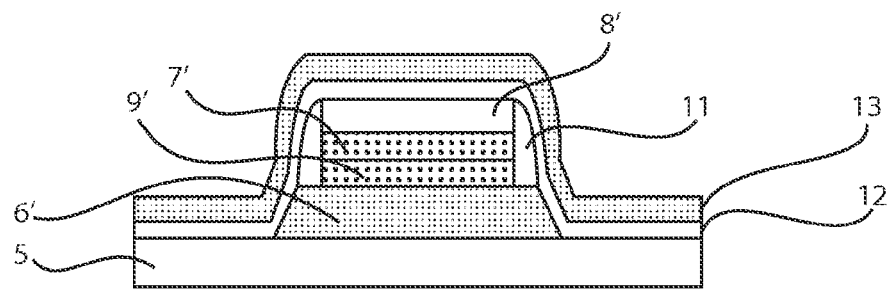
FIG. 6 is a side cross-sectional view depicting forming a second metal containing layer on the hydrogenated silicon containing layer, in accordance with the present disclosure.

FIG. 6 depicts one embodiment of forming a second metal containing layer 13 on the hydrogenated silicon containing layer 12. In some embodiments, the second metal containing layer 13 may be composed of aluminum, copper, cobalt, palladium, tungsten, titanium, platinum, silver, gold, nickel or combinations thereof. The second metal containing layer 13 may also be composed of metal semiconductor alloys, such as silicide materials, e.g., nickel silicide. The second metal containing layer 13 may be a single metal containing layer or be a multi-layered structure. The second metal containing layer 13 may be formed by physical vapor deposition (PVD), such as sputtering or plating, or may be formed using chemical vapor deposition (CVD). In some embodiments, the thickness of the second metal containing layer 13 may range from 5 nm to 100 nm. The second metal containing layer 13 is subsequently processed to provide the contact to at least one of the subsequently formed collector region and the subsequently formed emitter region.

Figure 7:
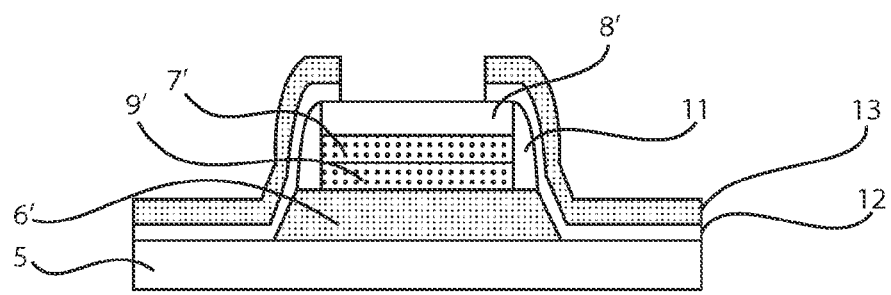
FIG. 7 is a side cross-sectional view depicting removing a portion of the second metal containing layer and the hydrogenated silicon containing layer that is present on the dielectric cap, in accordance with one embodiment of the present disclosure.
Figure 8:
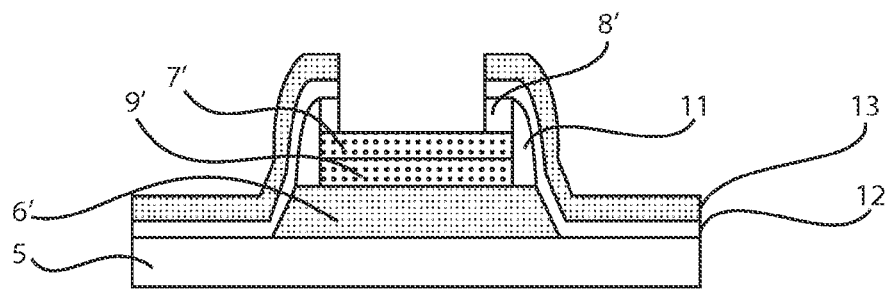
FIG. 8 is a side cross-sectional view depicting one embodiment of removing the dielectric cap.
Figure 9:
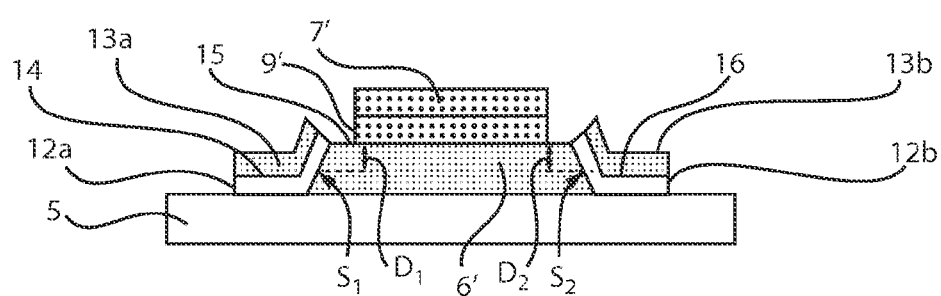
FIG. 9 is a side cross-sectional view depicting removing a portion of the second metal containing layer and the hydrogenated silicon containing layer that is present on the dielectric spacer, and removing the dielectric spacer, in accordance with one embodiment of the present disclosure.

FIGS. 7-9 depict one embodiment of a process flow for etching the second metal containing layer 13 and the hydrogenated silicon containing layer 12 to provide a collector contact 13a and a collector region 12a on a first side of the base region 6' and an emitter contact 13b and an emitter region 12b on a second side of the base region 6', in which the second side of the base region 6' is opposite the first side of the base region 6'.

FIG. 7 depicts one embodiment removing a portion of the second metal containing layer 13 and the hydrogenated silicon containing layer 12 that is present on the dielectric cap 8'. In one embodiment, removing the portions of the second metal containing layer 13 and the hydrogenated silicon containing layer 12 that are present on the dielectric cap 8' may begin with forming a second etch mask (not shown), such as a photoresist mask, exposing the portion of the second metal containing layer 13 and the hydrogenated silicon containing layer 12 that is to be removed. Following the formation of the second etch mask, a selective etch process removes the exposed portions of the second metal containing layer 13 and the hydrogenated silicon containing layer 12 selectively to the dielectric cap 8'. The etch process for removing the portion of the hydrogenated silicon containing layer 12 and the second metal containing layer 13 that are present over the dielectric cap 8' may be an anisotropic etch, such as reactive ion etch. In some embodiments, the etch process for exposing the upper surface of the dielectric cap 8', also removes portions of the hydrogenated silicon containing layer 12 and the second metal containing layer 13 that are present on the dielectric substrate layer 5, but are not adjacent to the base region 6'. Once the portions of the hydrogenated silicon containing layer 12 and the second metal containing layer 13 are removed to expose the upper surface of the underlying dielectric cap 8', the second etch mask may be removed. Alternatively, the second etch mask may be removed after the lift-off step illustrated in FIG. 9.

FIG. 8 depicts one embodiment of removing the exposed portions of the dielectric cap 8'. The exposed portions of the dielectric cap 8' may be removed by an etch process that is selective to the remaining portions of the second metal containing layer 13 and the base contact 7'. The etch process for removing the dielectric cap 8' may be a wet chemical etch, a plasma based etch, reactive ion etching or a combination thereof.

FIG. 9 depicts one embodiment of removing a portion of the second metal containing layer and a portion of the hydrogenated silicon containing layer that are present on the dielectric spacer, and removing the dielectric spacer, as well as any remaining portion of the dielectric cap. Following removal of the portion of the hydrogenated silicon containing layer that is present on the dielectric spacer, the remaining portion of the hydrogenated silicon containing layer provides the emitter region 12b and the collector region 12a of the heterojunction bipolar transistor. Following removal of the portion of the second metal layer that is present on the dielectric spacer, the remaining portion of the second metal containing layer provides the emitter contact 13b and the collector contact 13a.

In one embodiment, the portion of the second metal containing layer and the hydrogenated silicon containing layer that is present on the dielectric cap 8' and spacer 11 is removed using a lift-off process. In one example, an etch chemistry is used which can etch the cap layer 8' and the spacer 11 selective to the metal layer 7', hydrogenated silicon containing layer 12, metal layer 13, extrinsic base 9' and the base region 6'. In another example, a first etch chemistry is used that can etch the cap layer 8' selective to the spacer 11, metal layer 7', hydrogenated silicon containing layer 12, and metal layer 13; followed by a second etch chemistry than can etch the spacer 11 selective to metal layer 7', hydrogenated silicon containing layer 12, metal layer 13, extrinsic base 9' and the base region 6'. The etch process is may be a wet chemical etch, however a plasma based etch, or a combination of a wet chemical etch and a plasma etch may be used as well.

FIG. 9 depicts one embodiment of a heterojunction bipolar transistor formed in accordance with the present disclosure. In one embodiment, the collector region 12a is present on the dielectric substrate layer 5 and is in direct contact with a first sidewall S1 of the base region 6'. The collector region 12a includes a recessed portion having an upper surface 14 that is below an upper surface 15 of the base region 6'. In one embodiment, the dimension D1 separating the upper surface 15 of the base region 6' and the upper surface 14 of the recessed portion of the collector region 12a may range from 5 nm to 250 nm. In another embodiment, the dimension D1 separating the upper surface 15 of the base region 6' and the upper surface 14 of the recessed portion of the collector region 12a may range from 10 nm to 100 nm. In yet another embodiment, the dimension D1 separating the upper surface 15 of the base region 6' and the upper surface 14 of the recessed portion of the collector region 12a may range from 20 nm to 40 nm. An interface portion of the collector region 12a is adjacent to the recessed portion of the collector region 12a. The interface portion of the collector region 12a is in direct contact with the first sidewall S1 of the base region 6'. In some embodiments, the upper surface of the interface portion of the collector region 12a may extend above the upper surface 15 of the base region 6'.

The emitter region 12b of the heterojunction bipolar transistor is present on the dielectric substrate layer 5 and is in direct contact with a second sidewall S2 of the base region 6'. The second sidewall S2 of the base region 6' is on the opposite end of the base region 6' as the first sidewall S1. The emitter region 12b includes a recessed portion having an upper surface 16 that is below an upper surface 15 of the base region 6'. An interface portion of the emitter region 12b is adjacent to the recessed portion of the emitter region 12b. The interface portion of the collector region 12a is in direct contact with the second sidewall S2 of the base region 6'. In some embodiments, the upper surface of the interface portion of the collector region 12a may extend above the upper surface 15 of the base region 6'.

In one embodiment, the dimension D2 separating the upper surface 15 of the base region 6' and the upper surface 16 of the recessed portion of the emitter region 12b may range from 5 nm to 250 nm. In another embodiment, the dimension D2 separating the upper surface 15 of the base region 6' and the upper surface 16 of the recessed portion of the emitter region 12b may range from 10 nm to 100 nm. In yet another embodiment, the dimension D2 separating the upper surface 15 of the base region 6' and the upper surface 16 of the recessed portion of the collector region 12b may range from 20 nm to 40 nm.

Referring to FIG. 9, the contacts, i.e., emitter contact 13b and collector contact 13a, to each of the recessed portions of the emitter region 12a and the collector region 12b each have a lower surface that is vertically offset from the lower surface of the base contact 7'. Therefore, the collector and emitter contacts 13a, 13b are not coplanar with the base contact 7'. However, in some embodiments, the layer thicknesses may be chosen such that the vertical offset is minimized. In some embodiments, the outer edges of a base contact are aligned with the outer edges to the extrinsic base layer.

In prior heterojunction bipolar transistors, the material layer that provides the base region of the device extends past the sidewall of the overlying base contact into the regions of the device containing the collector region and emitter region. In these prior devices, the emitter region and the collector region are formed on the upper surface of the portion of the material layer for the base region that extends past the sidewall of the overlying base contact. The portion of the material layer for the base region that extends into the collector region and the emitter region of the device increases the access resistance of the collector and the emitter. The methods and structures provided by the present disclosure reduce the collector and emitter access resistance by removing the portion of the base layer that extends beyond the sidewalls of the base contact 7', as described above with reference to FIG. 4. In addition, by forming the collector region 12a and the emitter region 12b on the etched sidewalls S1, S2 of the base region 6' that are aligned with the sidewalls of the base contact 7', the methods and structures disclosed herein bring the collector region 12a, emitter region 12b, collector contact 13a, and emitter contact 13b in closer proximity to the portion of the base region 6' underlying the base contact 7'. As a result, the effective base width is reduced resulting in a higher transistor current gain.

Figure 10:
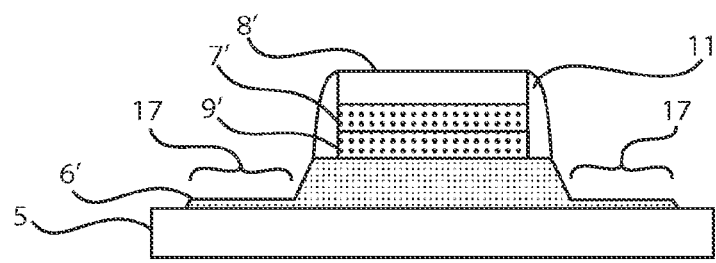
FIG. 10 is a side cross-sectional view depicting etching exposed portions of the base layer with a timed etch that removes only a portion of a thickness of the exposed portion of the base layer, wherein a remaining thickness of the exposed portion of the base layer that is etched provides a base region having a stepped sidewall, in accordance with another embodiment of the present disclosure.
Figure 11:
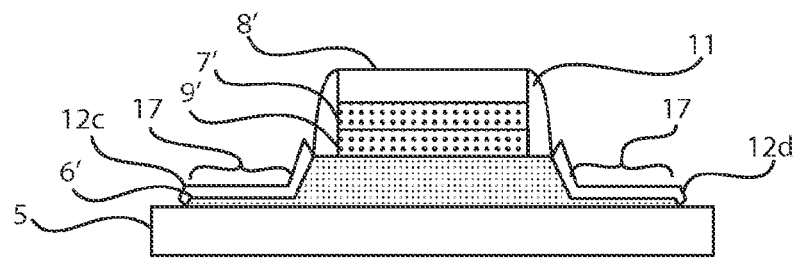
FIG. 11 is a side cross-sectional view depicting one embodiment of depositing a hydrogenated silicon containing layer with a low temperature deposition method on the remaining thickness of the base layer that is depicted in FIG. 10.
Figure 12:
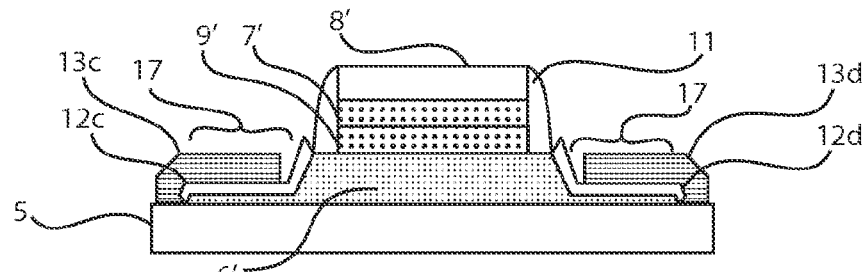
FIG. 12 is a side cross-sectional view of forming a second metal containing layer on the hydrogenated silicon containing layer depicted in FIG. 11, in accordance with one embodiment of the present disclosure.

FIGS. 10-12 depict another embodiment of a process flow for forming a heterojunction bipolar transistor. FIG. 10 depicts one embodiment of applying an etch process to the exposed portions of the base layer 6 that is depicted in FIG. 3, wherein the etch process does not remove the entirety of the thickness of the exposed portions of the base layer 6 being etched. In this embodiment, the etch process for etching the exposed portions of the base layer 6 is a time etch that terminates prior to removing the entire thickness of the exposed portions of the base layer 6. In the embodiment that is depicted in FIG. 10, the remaining thickness of the base layer 17 that extends beyond the portion of the base region 6' underlying the base contact 7' provides a base region 6' having a stepped sidewall. In one embodiment, the remaining thickness of the base layer 17 ranges from 5 nm to 150 nm. In another embodiment, the remaining thickness of the base layer 17 ranges from 10 nm to 50 nm. The remaining thickness of the base layer 17 is hereafter referred to as the stepped portion 17 of the base region 6'.

FIG. 11 depicts one embodiment of epitaxially forming a collector region 12c and an emitter region 12d on the stepped portion 17 and sidewall of the base region 6'. The material of the collector region 12c and the emitter region 12d may include hydrogenated silicon containing materials. The terms "epitaxially forming" and "epitaxial deposition" mean the growth of a semiconductor material on a deposition surface of a semiconductor material, in which the semiconductor material being grown has the same crystalline characteristics as the semiconductor material of the deposition surface. For example, if the stepped portion 17 of the base region 6' has a single crystalline crystal structure, the epitaxially formed collector region 12c and the epitaxially formed emitter region 12d will also have a single crystalline crystal structure. The epitaxially formed collector region 12c and the epitaxially formed emitter region 12d may also have a polycrystalline crystal structure. The term "epitaxial" as used to describe a material denotes that the material was formed using an epitaxial deposition process and has the same crystalline structure as the deposition surface on which the material was formed.

In some embodiments, epitaxial deposition can be a selective deposition process. For example, portions of deposited material on an amorphous surface, such as a dielectric, is amorphous and portions of deposited material on a crystalline surface is crystalline. In some embodiments, the collector region 12c and an emitter region 12d are composed of a hydrogenated silicon containing material deposited by selective epitaxial deposition using a low temperature PECVD process. In one embodiment, the selective epitaxial growth of the hydrogenated silicon containing material for the emitter region 12c and the collector region 12d is performed in a hydrogen diluted silane environment. For example, to provide for selective epitaxial deposition of a hydrogenated silicon containing material, the gas ratio of hydrogen gas to silane gas ($[H_2]/[SiH_4]$) at approximately 200° C. may range from between 0 to 1000. In some embodiments, epitaxially growth of silicon begins at a gas ratio of about 5-10. It is noted that silane gas is not the only silicon containing precursor suitable for selective epitaxial growth of hydrogenated silicon containing materials. For example, the silicon source can also be dichlorosilane (DCS), $SiF_4$, $SiCl_4$ or combinations thereof. The material deposited for the collector region 12c and the emitter region 12d may be in-situ doped to provide an n-type or p-type conductivity. Dopant gases may include phosphine ($PH_3$) to provide n-type dopants, or diborane ($B_2H_6$) or trimethylboron (TMB) to provide p-type dopants.

In some embodiments, the radio-frequency (RF) or direct current (DC) low temperature PECVD process for providing selective epitaxial growth of hydrogenated silicon is performed at deposition temperatures ranging from about room temperature, e.g., 25° C., to 450° C. In another embodiment, the deposition temperature of the low temperature plasma enhanced chemical vapor deposition (CVD) process ranges from 150° C. to 250° C. The plasma power density may range from 2 $mW/cm^2$ to 2000 $mW/cm^2$. A deposition pressure for the selective epitaxial deposition process may range from 10 mtorr to 5 torr. In addition to PECVD, the selective epitaxial deposition process may also be provided by hot wire chemical vapor deposition (HWCVD).

The above described low temperature PECVD process forms crystalline hydrogenated silicon containing material on semiconductor deposition surfaces, such as the stepped portion 17 and sidewall of the base region 6', and forms amorphous hydrogenated silicon containing material on the non-crystalline surfaces, such as the dielectric spacers 11, the dielectric cap 8' and the exposed portions of the dielectric substrate layer 5. Further details regarding the above described low temperature PECVD process for epitaxially forming hydrogenated silicon containing materials are described in U.S. Patent Publication No. 2012/0210932, which is owned by the assignee of the present disclosure, and is incorporated herein by reference.

Still referring to FIG. 11, in some embodiments, the amorphous hydrogenated silicon containing material may be removed selectively to the crystalline hydrogenated silicon containing material by an etch process employing a $H_2$ plasma (hereafter referred to as $H_2$ plasma etch). In one embodiment, the $H_2$ plasma etch is performed at 150° C. at 900 mtorr, resulting in an etch selectivity of approximately 1:3 for a crystalline hydrogenated silicon containing material with respect to an amorphous hydrogenated silicon containing material. It is noted that the above described $H_2$ plasma etch is provided for illustrative purposes and is not intended to limit the present disclosure. For example, the non-epitaxial portion of the hydrogenated silicon containing material, e.g., amorphous hydrogenated silicon containing material, that is grown on the dielectric spacer 11 and the dielectric cap 8' can be etched using gases including HCl, $Cl_2$, Ar and combinations thereof. The aforementioned etch gasses can also be used in combination with the $H_2$ plasma etch. The epitaxial deposition of the hydrogenated silicon containing material and the $H_2$ plasma etch may be performed sequentially or concurrently in a same chamber. Following the $H_2$ plasma etch to remove the amorphous hydrogenated silicon containing material, the crystalline hydrogenated silicon containing material that remains on the stepped portion 17 and sidewall of the base region 6' provides the collector region 12c and the emitter region 12d of the heterojunction bipolar transistor. Further details regarding the above described $H_2$ plasma etch are described in U.S. Patent Publication No. 2012/0210932, which is owned by the assignee of the present disclosure, and is incorporated herein by reference.

The crystalline hydrogenated silicon containing material that provides the collector region 12c and the emitter region 12d of the heterojunction bipolar transistor that is depicted in FIG. 11 is similar to the hydrogenated silicon containing material that provides the collector region 12a and the emitter region 12b of the heterojunction bipolar transistor depicted in FIG. 9. Therefore, the description of the composition, conductivity type, and dopant concentration of the hydrogenated silicon containing material that provides the collector region 12a and the emitter region 12b that are depicted in FIG. 9 is suitable for describing the composition, conductivity and dopant concentration of the crystalline hydrogenated silicon containing material that provides the collector region 12c and the emitter region 12d that are depicted in FIG. 11.

FIG. 12 depicts one embodiment of forming a collector contact 13c to the collector region 12c and an emitter contact 13d to the emitter region 12d. The collector contact 13c and the emitter contact 13d may be composed of any metal, such as aluminum, copper, cobalt, palladium, tungsten, titanium, platinum, silver, gold, nickel or combinations thereof. In some embodiments, prior to forming the metal for the collector contact 13c and the emitter contact 13d, a block mask, e.g., photoresist block mask, may be formed over the dielectric cap 8' and the dielectric spacer 11. The block mask obstructs the metal that is deposited for the collector contact 13c and the emitter contact 13d from being formed on the dielectric cap 8' and the dielectric spacer 11. Following formation of the block mask, the metal for the collector contact 13c and the emitter contact 13d may be deposited using physical vapor deposition (PVD), such as plating or sputtering, or chemical vapor deposition. The block mask is subsequently removed to pattern the metal layer by lift-off. In some other embodiments, a blanket metal layer is deposited and then patterned by lithography and etching. Similar to the embodiment depicted in FIGS. 1-9, the structures and methods described above with reference to FIGS. 10-12 provide a heterojunction bipolar transistor having a low access resistance.

Figure 13:
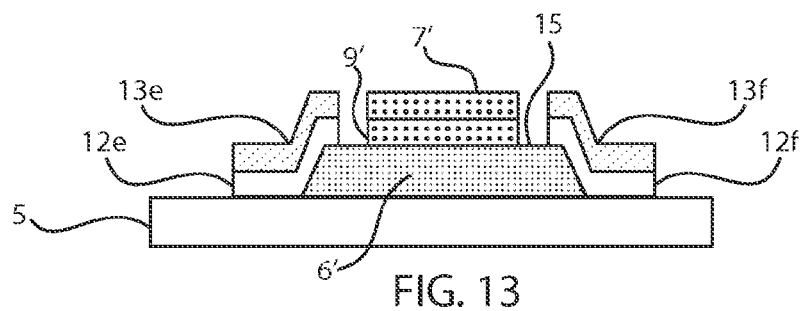
FIGS. 13 and 14 are side cross-sectional views of further embodiments of a heterojunction bipolar transistor formed using a process flow that does not include dielectric spacers, in accordance with the present disclosure.

FIG. 13 depicts one embodiment of the present disclosure that does not employ a dielectric spacer 11, as depicted in FIGS. 3-12, to separate the collector region 12e and the emitter region 12f from the base region 6' of the heterojunction bipolar transistor. The structure depicted in FIG. 13 is formed by a method that employs a first etch mask and a first etch process to define the base contact 7' and the optional extrinsic base region 9' without etching the base layer similar to the method that is described above to provide the structure depicted in FIG. 2. In the structure depicted in FIG. 13, the dielectric cap 8' that is described in FIG. 2 may be omitted. In a following process step, a second etch mask and second etch process is employed to etch the base layer to provide the base region 6' of the heterojunction bipolar transistor. Thereafter, a stack of a hydrogenated silicon containing layer and a metal containing layer may then be blanket deposited on the base contact 7', the exposed portions of the base region 6', and the exposed portion of the dielectric substrate layer 5. The blanket deposited stack of the hydrogenated silicon containing layer and the metal containing layer may then be patterned and etched using a third mask and a third etch process to remove the portion of the metal containing layer and the hydrogenated silicon containing layer that is present on the base contact 7'. The remaining portion of the hydrogenated silicon containing layer following the third etch process provides the collector region 12e and the emitter region 12f of the heterojunction bipolar transistor. The remaining portion of the metal containing layer provides the collector contact 13e and the emitter contact 13f. In the embodiment depicted in FIG. 13, a portion of the collector region 12e and a portion of the emitter region 12f may extend onto an upper surface 15 of the base region 6'.

The hydrogenated silicon containing material that provides the collector region 12e and the emitter region 12f of the heterojunction bipolar transistor depicted in FIG. 13 is similar to the hydrogenated silicon containing material that provides the collector region 12a and the emitter region 12b of the heterojunction bipolar transistor that is depicted in FIG. 9. Therefore, the description of the composition, conductivity type, and dopant concentration of the hydrogenated silicon containing material that provides the collector region 12a and the emitter region 12b that is depicted in FIG. 9 is suitable for describing the composition, conductivity and dopant concentration of the hydrogenated silicon containing material that provides the collector region 12e and the emitter region 12f that is depicted in FIG. 13. Similarly, the description of the metal compositions of the collector contact 13a and the emitter contact 13b that are depicted in FIG. 9 is suitable for the description of the collector contact 13e and the emitter contact 13f that are depicted in FIG. 13.

Figure 14:
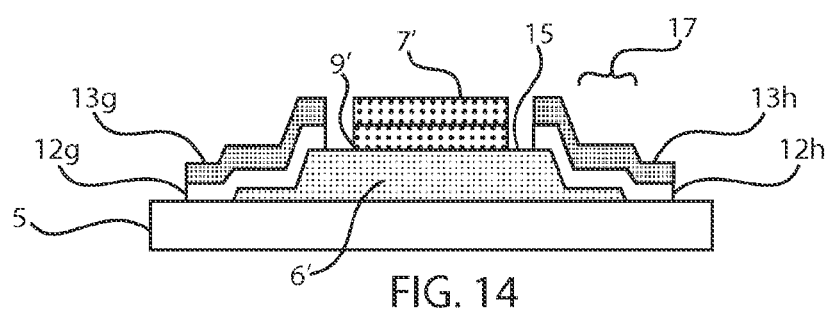

FIG. 14 depicts yet another embodiment of the present disclosure that does not employ a dielectric spacer 11, as depicted in FIGS. 3-12, to separate the collector region 12e and the emitter region 12f from the base region 6' of the heterojunction bipolar transistor. The heterojunction bipolar transistor depicted in FIG. 14, and method for forming the heterojunction bipolar transistor depicted in FIG. 14, are similar to the methods and structures that are described above with reference to FIG. 13. The heterojunction bipolar transistor depicted in FIG. 14 includes a base region 6' including a stepped portion 17.

In one embodiment, the structure depicted in FIG. 14 is formed by a method that employs a first etch mask and a first etch process to define the base contact 7' and the optional extrinsic base region 9' without etching the base layer similar to the method described to provide the structure depicted in FIG. 2. In a following process step, a second etch mask and second etch process is employed to etch the base layer to provide the base region 6' of the heterojunction bipolar transistor. The stepped portions 17 of the base region 6' depicted in FIG. 14 may be formed using the method for forming the stepped portions 17 that is describe above with reference to FIG. 10. For example, the stepped portion 17 of the base region 6' may be formed using a timed etch process. Thereafter, a stack of a hydrogenated silicon containing layer and a metal containing layer may then be blanket deposited on the base contact 7', the stepped portion 17 and sidewall of the base region 6', and the exposed portion of the dielectric substrate layer 5. The blanket deposited stack of the hydrogenated silicon containing layer and the metal containing layer may then be patterned and etched using a third mask and a third etch process to remove the portion of the metal containing layer and the hydrogenated silicon containing layer that is present on the base contact 7'. The remaining portion of the hydrogenated silicon containing layer following the third etch process provides the collector region 12g and the emitter region 12h of the heterojunction bipolar transistor. The remaining portion of the metal containing layer provides the collector contact 13g and the emitter contact 13h. In the embodiment depicted in FIG. 13, a portion of the collector region 12g and a portion of the emitter region 12h may extend onto an upper surface 15 of the base region 6'.

While the present disclosure has been particularly shown and described with respect to preferred embodiments thereof, it will be understood by those skilled in the art that the foregoing and other changes in forms and details may be made without departing from the spirit and scope of the present disclosure. It is therefore intended that the present disclosure not be limited to the exact forms and details described and illustrated, but fall within the scope of the appended claims.

What is claimed is:

1. A method of forming a heterojunction bipolar transistor (HBT) comprising:
    forming a dielectric cap over a portion of a base layer, the base layer being on a dielectric substrate layer, wherein a first metal containing layer is present between the dielectric cap and the base layer;
    etching the first metal containing layer selectively to the dielectric cap and the base layer to form a base contact;
    forming a dielectric spacer on a sidewall of the base contact and the dielectric cap;
    etching exposed portions of the base layer selectively to the dielectric cap, the dielectric substrate layer, and the dielectric spacer, wherein a remaining portion of the base layer provides a base region, and wherein sidewalls of the base region are substantially aligned to an outermost sidewall of the dielectric spacer;
    depositing a hydrogenated silicon containing layer with a low temperature deposition method, wherein at least a portion of the hydrogenated silicon containing layer is formed on at least sidewalls of the base region;
    forming a second metal containing layer on the hydrogenated silicon containing layer;
    forming a first etch mask exposing a portion of the second metal containing layer and the hydrogenated silicon containing layer that is present on the dielectric cap;
    removing the portion of the second metal containing layer and the hydrogenated silicon containing layer that is exposed;
    removing the dielectric cap;
    forming a second etch mask over a portion of the second metal containing layer that provides an emitter contact on a first side of the base region, and an collector contact on a second side of the base region opposing the first side;
    removing a portion of the second metal containing layer and the hydrogenated silicon containing layer that is present on the dielectric spacer; and
    removing the dielectric spacer.

2. The method of claim 1, wherein the stack of the first metal containing layer and the dielectric cap layer further comprises an extrinsic base layer between and in direct contact with the base layer and the first metal containing layer, wherein the extrinsic base layer is etched during said etching of the dielectric cap layer and the first metal containing layer to provide an extrinsic base region.

3. The method of claim 2, wherein the extrinsic base region is comprised of hydrogenated silicon containing material having a p-type conductivity and the base region is comprised of a germanium containing material having a p-type conductivity, wherein a dopant concentration that provides the p-type conductivity of the extrinsic base region is greater than a dopant concentration that provides the p-type conductivity of the base region.

4. The method of claim 1, wherein the base layer is present on a dielectric substrate layer, and the etching of the exposed portions of the base layer selectively to the dielectric cap comprises an etch that removes an entirety of the exposed portion of the base layer, wherein the etch is selective to the dielectric substrate layer.

5. The method of claim 1, wherein the depositing of the hydrogenated silicon containing layer with the low temperature deposition method comprises plasma enhanced chemical vapor deposition having a deposition temperature that is no greater than 250° C.

6. The method of claim 1, wherein the hydrogenated silicon containing layer is deposited on exposed portions of the dielectric substrate layer, the sidewalls of the base region, the dielectric spacer and the dielectric cap.

7. The method of claim 1, wherein the base layer is present on a dielectric substrate layer, and the etching of the exposed portions of the base layer selectively to the dielectric cap comprises a timed etch that removes a portion of a thickness of the exposed portion of the base layer, wherein a remaining thickness of the exposed portion of the base layer that is etched is present on the dielectric substrate layer.

8. A method of forming a heterojunction bipolar transistor (HBT) comprising:
    forming a dielectric cap over a portion of a base layer, the base layer being on a dielectric substrate layer, wherein a first metal containing layer is present between the dielectric cap and the base layer;
    etching the first metal containing layer selectively to the dielectric cap and the base layer to form a base contact;
    forming a dielectric spacer on a sidewall of the base contact and the dielectric cap;
    etching exposed portions of the base layer selectively to the dielectric cap, the dielectric substrate layer, and the dielectric spacer, wherein a remaining portion of the base layer provides a base region, and wherein sidewalls of the base region are substantially aligned to an outermost sidewall of the dielectric spacer;
    depositing a hydrogenated silicon containing layer with a low temperature deposition method, wherein at least a portion of the hydrogenated silicon containing layer is deposited on exposed portions of the dielectric substrate layer, the sidewalls of the base region, the dielectric spacer, and the dielectric cap;

forming a second metal containing layer on the hydrogenated silicon containing layer; and etching the second metal containing layer and the hydrogenated silicon containing layer to provide an emitter contact and an emitter region on a first side of the base region and a collector contact and a collector region on a second side of the base region opposing said first side.

* * * * *